United States Patent [19]
Oyama

[11] Patent Number: 5,327,385
[45] Date of Patent: Jul. 5, 1994

[54] METHOD OF ERASURE FOR A NON-VOLATILE SEMICONDUCTOR MEMORY DEVICE

[75] Inventor: Kenichi Oyama, Tokyo, Japan

[73] Assignee: NEC Corporation, Tokyo, Japan

[21] Appl. No.: 19,899

[22] Filed: Feb. 19, 1993

[30] Foreign Application Priority Data

Feb. 19, 1992 [JP] Japan ................... 4-031186

[51] Int. Cl.$^5$ ............................................. G11C 11/40
[52] U.S. Cl. .................................... 365/218; 365/185
[58] Field of Search ............... 257/316, 320, 321, 322, 257/323; 365/218, 185

[56] References Cited

U.S. PATENT DOCUMENTS 5,233,562  8/1993  Ong et al. ..................... 365/218

OTHER PUBLICATIONS

"A self-convergence Erasing Scheme For A Simple Stacked Gate Flash EEPROM", *IEEE*, By S. Yamada et al., pp. 307–310.
"Drain-disturb characteristic of an erased Flash EE-PROM cell", 10a-SF-22, By S. Yamada et al., English translation.
"A Self-Convergence Erasing Scheme for a Simple Stacked Gate Flash EEPROM", 28p-ZM-14, By T. Suzuki et al., English translation.

*Primary Examiner*—Eugene R. LaRoche
*Assistant Examiner*—F. Niranjan
*Attorney, Agent, or Firm*—Young & Thompson

[57] ABSTRACT

The invention provides a method of erasure for a non-volatile semiconductor memory device having a floating gate. For a first time interval, a voltage having one polarity is applied to a control gate of said memory device under a bias application between source and drain regions so as to accomplish an erasure by a tunneling of electrons from said floating gate through a tunneling oxide film. For a second time interval after said first time interval, a voltage having an opposite polarity to said one polarity is applied to said control gate of said memory device without bias application between said source and drain regions so as to accomplish a convergence of a threshold voltage into a voltage level by a tunneling of electrons from a channel region of said memory device to said floating gate through said tunneling oxide film.

10 Claims, 7 Drawing Sheets

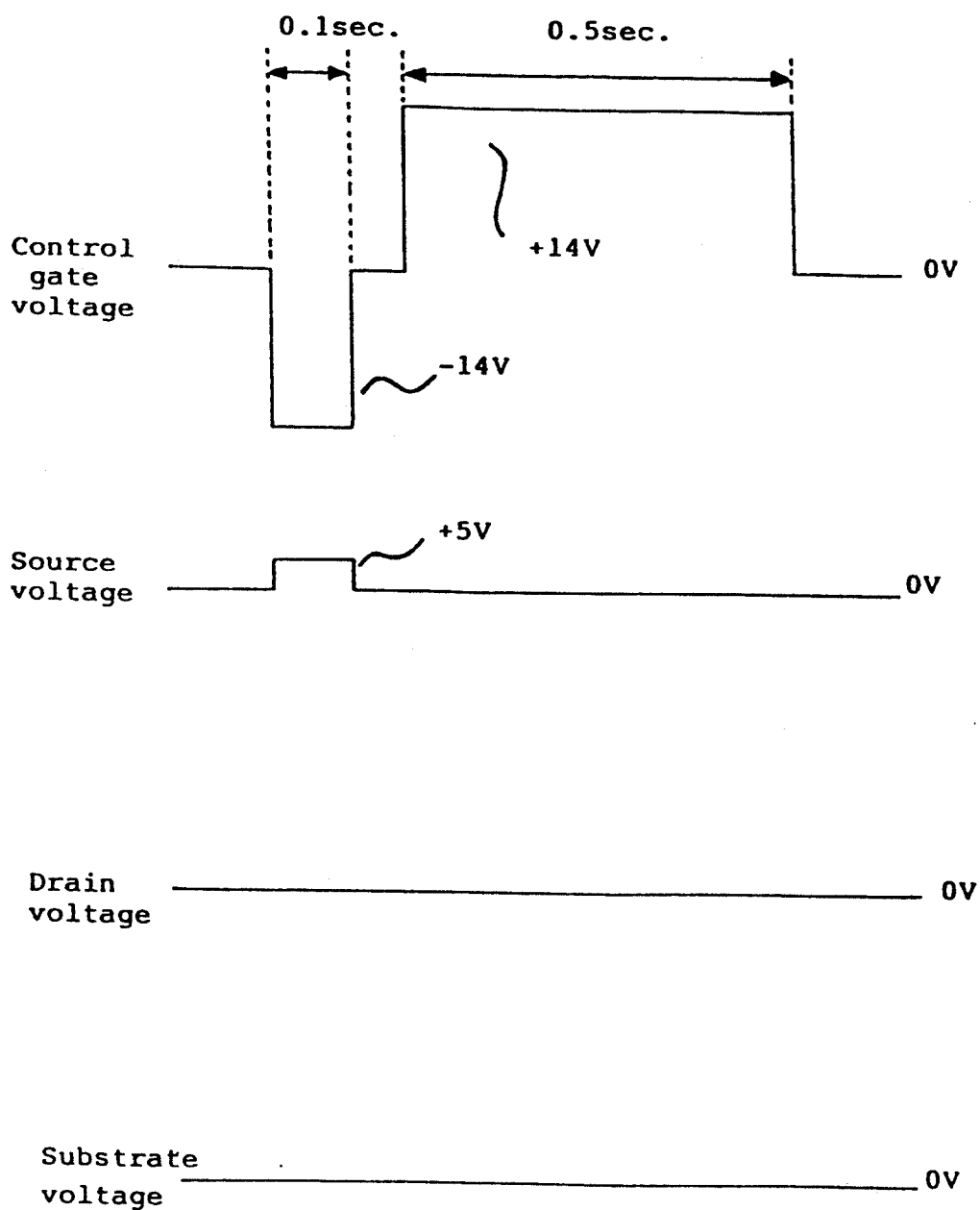

METHOD OF ERASURE FOR A NON-VOLATILE SEMICONDUCTOR MEMORY DEVICE

BACKGROUND OF THE INVENTION

The invention relates to a method of erasure for a non-volatile semiconductor memory device having a floating gate.

One of non-volatile semiconductor memory devices is an electrically erasable and programmable read only memory (EEPROM) having a floating gate. FIG. 1 illustrates a typical structure of the electrically erasable and programmable read only memory (EEPROM) having the floating gate. The electrically erasable and programmable read only memory (EEPROM) having the floating gate illustrated in FIG. 1 is an n-type channel metal oxide semiconductor field effect transistor (MOSFET).

In FIG. 1, the electrically erasable and programmable read only memory (EEPROM) device has a p-type silicon substrate 11. Drain and source diffusion layers 16 and 17 are formed in upper portions of the p-type silicon substrate 11 by using a diffusion method such as an ion-implantation technique with an n-type dopant of arsenic or phosphorus. The formation of the n-type drain and source diffusion layers 16 and 17 defines a channel region on the p-type silicon substrate 11. A tunneling oxide film 12 is formed on the channel region in the p-type silicon substrate 11. A floating gate 13 made of polycrystalline silicon is formed on the tunneling oxide film 12. An inter-layer insulator 14 is formed on the floating gate 13. A control gate 15 made of polycrystalline silicon is formed on the inter-layer insulator 14. Such gate structure is formed by using normal processes such as a thermal oxidation of silicon, a chemical vapor deposition, a photo-lithography and a dray etching.

The operations of the electrically erasable and programmable read only memory (EEPROM) device will be described. The programming is accomplished by a hot electron injection through a tunneling oxide film 12 into the floating gate 13 thereby making a threshold voltage of the MOSFET device high. In contrast, the erasure is accomplished by a Fowler-Nordheim tunneling of electrons from the floating gate 13 through the tunneling oxide film 12 thereby making the threshold voltage of the MOSFET device low.

In such non-volatile semiconductor memory device, and thus the electrically erasable and programmable read only memory (EEPROM) device, a threshold voltage after erasure is variable, which has been known in the art. A large variation or a broad distribution of the threshold voltage after erasure is one of the most considerable problems in performances possessed by such non-volatile semiconductor memory device and thus the electrically erasable and programmable read only memory (EEPROM) device. Namely, the large variation or the broad distribution of the threshold voltage after erasure makes performances of the non-volatile semiconductor memory device so unstable that high speed and precise memory actions of the device are no longer realized.

In recent years, the minimization of the device size is considerably improved. The minimization of the device size renders such problem in the large variation or the broad distribution of the threshold voltage after erasure considerable. Thus, such non-volatile semiconductor memory device are forced into being engaged with such problem in the broad distribution of the threshold voltage after erasure operation.

It is, therefore, required to suppress or prevent the non-volatile semiconductor memory device or the electrically erasable and programmable read only memory (EEPROM) device to exhibit such large variation or broad distribution of the threshold voltage after erasure.

One of methods of suppressing the non-volatile semiconductor memory device to exhibit such large variation or broad distribution of the threshold voltage after erasure is disclosed in Technical Digest of 1991 International Electron Device Meeting, pp-307-310. The erasure method will be described in detail with reference to FIGS. 1, 2 and 3.

The non-volatile semiconductor memory device has the same structure as illustrated in FIG. 1. The feature sizes of the device are as follows. The gate length is 0.6 (0.8) micrometers. The gate width is 0.6 micrometers. The thickness of the tunnel oxide film 12 is 10 nanometers. The thickness of the inter-layer insulator 14 is 22 nanometers.

The erasure method, to obtain tight distribution of the threshold voltage after erasure, utilizes an avalanche hot carrier injection through the tunneling oxide film 12 into the floating gate after erasure, and thus utilizes a Fowler-Nordheim tunneling of the hot carriers. As the device size of the MOSFET is minimized, an electric field in the device becomes high. A high electric field makes the energy of electrons high thereby electrons conduct as hot electrons. Further, such high electric field causes an impact ionization at a drain junction. The impact ionization generates an electron-hole pair thereby exhibiting the avalanche breakdown.

FIG. 2 illustrates characteristics of the gate current $I_g$ versus the floating gate voltage $V_{fg}$ for the electrically erasable and programmable read only memory (EEPROM) device having the floating gate 13. When the floating gate voltage $V_{fg}$ is higher than the drain-source voltage $V_{DS}$, the avalanche hot carrier injection through the tunneling oxide film 12 into the floating gate 13 occurs. Thus, the high electric field causes the impact ionization in a space charge region at an junction interface between the n-type drain diffusion layer 16 and the channel region. The impact ionization generates electron-hole pairs in a space charge region at an junction interface between the n-type drain diffusion layer 16 and the channel region. This causes the avalanche breakdown so that the carriers, and thus hot electrons or hot holes are injected through the tunneling oxide film 12 into the floating gate 13 of the device.

When the floating gate voltage $V_{fg}$ is lower than a balance point floating gate voltage $V_{fg}^*$, a channel electron induced avalanche hot hole injection (CEIA-HH) so occurs that the hot holes are injected from the channel region through the tunneling oxide film 12 into the floating gate 13 of the device. In contrast, when the floating gate voltage $V_{fg}$ is higher than a balance point floating gate voltage $V_{fg}^*$, a channel electron induced avalanche hot electron injection (CEIA-HE) so occurs that the hot electrons are injected from the channel region through the tunneling oxide film 12 into the floating gate 13 of the device. When the floating gate voltage $V_{fg}$ is much higher than a balance point floating gate voltage $V_{fg}^*$, a channel hot electron injection (CHE) so occurs that the hot electrons are injected from the channel region through the tunneling oxide film 12 into the floating gate 13 of the device. When the floating gate voltage $V_{fg}$ is equal to a balance point floating gate voltage $V_{fg}*$, the channel electron induced avalanche hot hole injection (CEIA-HH) and the channel electron induced avalanche hot electron injection (CEIA-HE) are in balance.

If the floating gate voltage $V_{fg}$ is lower than a balance point floating gate voltage $V_{fg}*$, the hot holes are injected through the tunneling oxide film 12 into the floating gate 13 of the device thereby the floating gate voltage $V_{fg}$ is increased and approaches the balance point floating gate voltage $V_{fg}*$. As a result, the gate current $I_g$ does not occur because the channel electron induced avalanche hot hole injection (CEIA-HH) and the channel electron induced avalanche hot electron injection (CEIA-HE) are in balance at the balance point floating gate voltage $V_{fg}*$. In contrast, if the floating gate voltage $V_{fg}$ is higher than a balance point floating gate voltage $V_{fg}*$, the hot electrons are injected through the tunneling oxide film 12 into the floating gate 13 of the device thereby the floating gate voltage $V_{fg}$ is lowered and also approaches the balance point floating gate voltage $V_{fg}*$. As a result, the gate current $I_g$ also does not occur because the channel electron induced avalanche hot hole injection (CEIA-HH) and the channel electron induced avalanche hot electron injection (CEIA-HE) are in balance at the balance point floating gate voltage $V_{fg}*$.

Finally, to realize the stable threshold voltage after erasure, such electrically erasable and programmable read only memory (EEPROM) device exhibits a self-convergence of the floating gate voltage $V_{fg}$ into the balance point floating gate voltage $V_{fg}*$ after erasure thereby realizing the stable threshold voltage after erasure.

The erasure operation of the electrically erasable and programmable read only memory (EEPROM) device will be described with reference to FIG. 3. FIG. 3 illustrates waveforms of voltage applied to respective electrodes of the control gate 15, the source 17 and drain 16 during data erasure operation. The erasure operation makes the n-type drain diffusion layer 16 remain at 0 V during the erasure operation. A negative pulse voltage is applied to the electrode the control gate 15 so that the control gate 15 takes −13 V for 0.1 seconds, after which the voltage takes 0 V. Concurrently, a positive pulse voltage is applied to the electrode of the n-type source diffusion layer 17 so that the n-type source diffusion layer 17 takes +5 V for 0.6 seconds, after which the voltage takes 0 V.

For a first time interval of 0.1 seconds, the control gate 15 takes a negative voltage of −13 V and the source diffusion layer 17 takes a positive voltage +5 V. In this first time interval of 0.1 V, the discharge of electrons from the floating gate 13 by the Fowler-Nordheim tunneling occurs thereby accomplishing the erasure. Further, the over-erasure is so accomplished that the floating gate 13 takes a higher voltage value than the balance point floating gate voltage $V_{fg}*$ of 2.0 V. After that, a second time interval of 0.5 seconds follows the first time interval of 0.1 second. For the second time interval, the control gate 15 takes 0 V and the voltage of the source diffusion layer 17 remains at the positive voltage +5 V for a remaining time interval of 0.5 seconds. The voltage application to the electrode of the source diffusion layer 17 causes the channel carrier induced avalanche hot electron injection (CEIA-HE) thereby hot electrons are injected through the tunneling oxide film 12 into the floating gate 13. This makes the floating gate voltage $V_{fg}$ converge into the stable point of the balance point floating gate voltage $V_{fg}*$. As a result, the threshold voltage in connection with the control gate 15 also converges into a stable voltage value thereby making the distribution of the threshold voltage after erasure tight.

The above erasure method for the electrically erasable and programmable read only memory (EEPROM) device having the floating gate, however, provides the following disadvantages. As described above, the above erasure method utilizes the avalanche breakdown phenomenon caused at the space charge region at the junction interface of the n-type drain diffusion layer 16 for accomplishment of the erasure. Then, the space charge regions at the junction interface of the n-type drain and source diffusion layers 16 and 17 respectively exhibit the impact ionization phenomenon which generates electron-hole pairs. The avalanche phenomenon subjects a damage to the drain and source diffusion layers 16 and 17 and thus causes the junction breakdown between the drain and source diffusion layers 16 and 17 and the channel region.

In addition, the above self-convergence process for threshold voltage after erasure requires the bias between the drain and source diffusion layers 16 and 17 thereby a large power consumption is required.

SUMMARY OF THE INVENTION

Accordingly, it is a primary object of the present invention to provide a novel erasure method for a non-volatile semiconductor memory device having a floating gate, which permits suppressing a distribution of a threshold voltage after erasure to become broad.

It is a further object of the present invention to provide a novel erasure method for an electrically erasable and programmable read only memory device having a floating gate; which permits realizing a constant and precise threshold voltage after erasure.

It is a still further object of the present invention to provide a novel erasure method for an electrically erasable and programmable read only memory device having a floating gate, which permits suppressing a damage of source and drain diffusion layers by an avalanche breakdown.

It is a still further object of the present invention to provide a novel erasure method for an electrically erasable and programmable read only memory device having a floating gate with a low power consumption.

The above and other objects, features and advantages of the present invention will be apparent from the following descriptions.

The present invention intends to provide a novel method of erasure for a non-volatile semiconductor memory device having a floating gate such as a field effect transistor having a floating gate serving as an electrically erasable and programmable read only memory (EEPROM). The novel method does not utilize the avalanche breakdown for accomplishing the convergence of the threshold voltage into a predetermined voltage value after erasure.

For a first time interval, a voltage having one polarity is applied to a control gate of the memory device. Concurrently, a bias is applied between the source and drain diffusion layers. As a result, electrons stored in a floating gate exhibits a Fowler-Nordheim tunneling from the floating gate through a tunneling oxide film thereby accomplishing a discharge of electrons from the floating gate. Consequently, the erasure is accomplished. An intermediate time interval follows the first time interval. A second time interval follows the intermediate time interval.

For the second time interval, a voltage having an opposite polarity to the above one polarity is applied to the control gate of the memory device without bias application between said source and drain diffusion layers. Then, electrons exhibit a Fowler-Nordheim tunneling from a channel region of the device into the floating gate through the tunneling oxide film. Accordingly, a threshold voltage converges into a predetermined voltage value thereby suppressing the threshold voltage after erasure to be varied.

BRIEF DESCRIPTION OF THE DRAWINGS

Preferred embodiments of the present invention will hereinafter fully be described in detail with reference to the accompanying drawings.

FIG. 5 is a view illustrative of wave-forms of voltage pulse signals to be applied to respective electrodes of a control gate and source and drain diffusion layers in a first embodiment according to the present invention.

PREFERRED EMBODIMENTS OF THE INVENTION

The present invention provides a novel method of erasure for a non-volatile semiconductor memory device having a floating gate. In preferred embodiments of the present invention, the non-volatile semiconductor memory device having a floating gate has the same structure as that of the prior art of the electrically erasable and programmable read only memory (EEPROM) device of the floating gate metal oxide semiconductor field effect transistor (the floating gate MOSFET) as illustrated in FIG. 4.

Figure 1:
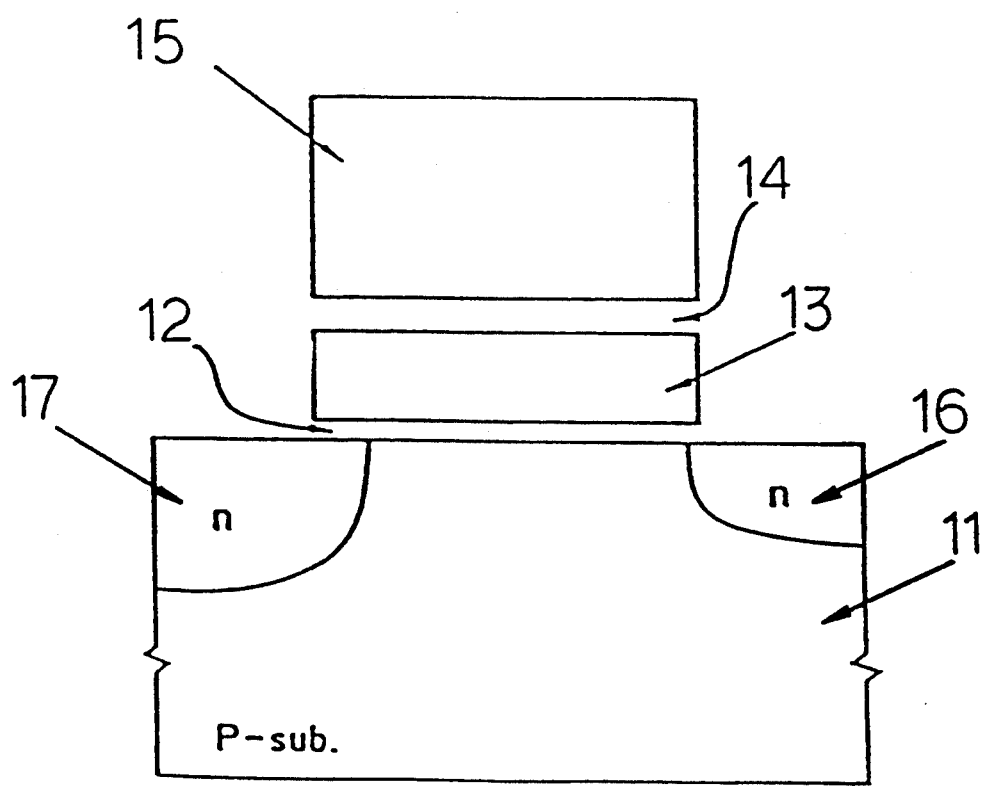
FIG. 1 is a fragmentary cross sectional elevation view illustrative of a structure of a non-volatile semiconductor memory device having a floating gate.
Figure 2:
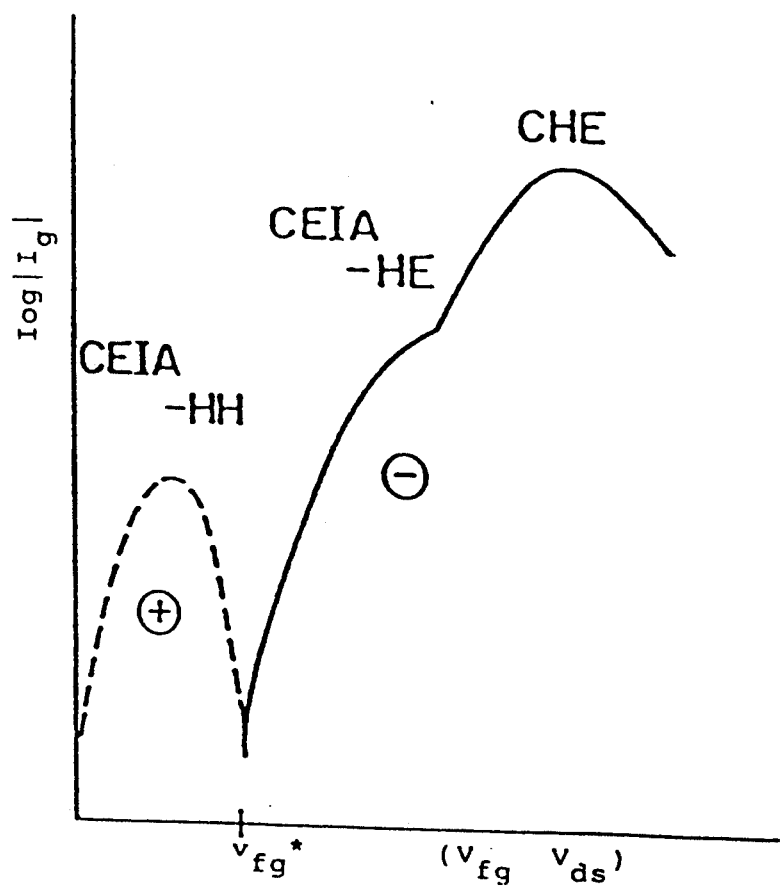
FIG. 2 is a view illustrative of characteristics of a drain current $I_g$ versus a floating gate voltage $V_{fg}$.
Figure 3:
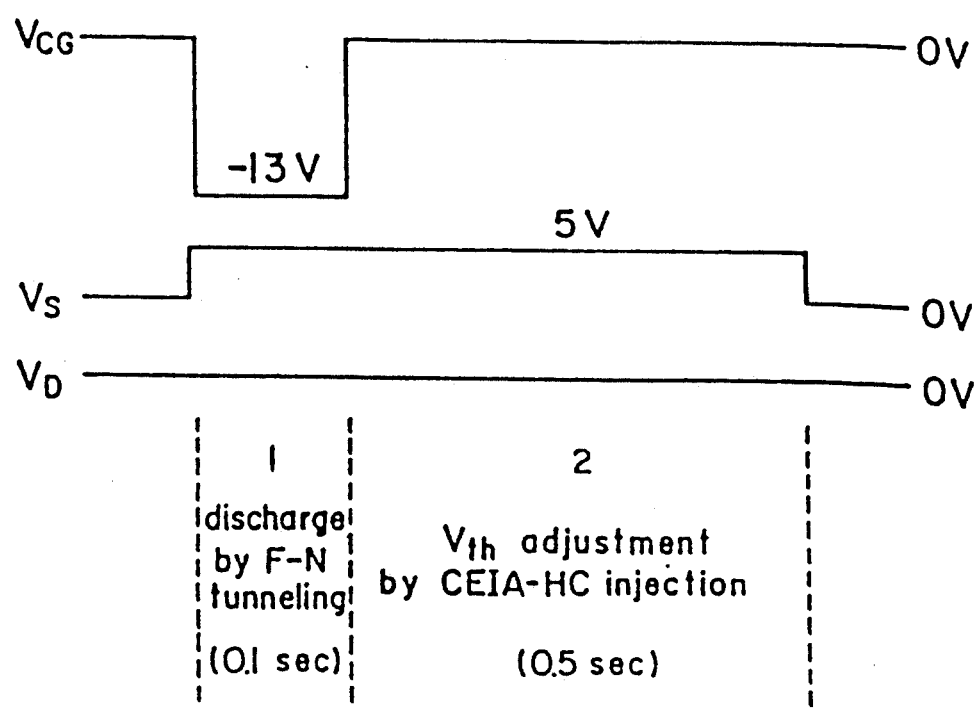
FIG. 3 is a view illustrative of wave-forms of voltage pulse signals to be applied to respective electrodes of a control gate and source and drain diffusion layers in the prior art.
Figure 4:
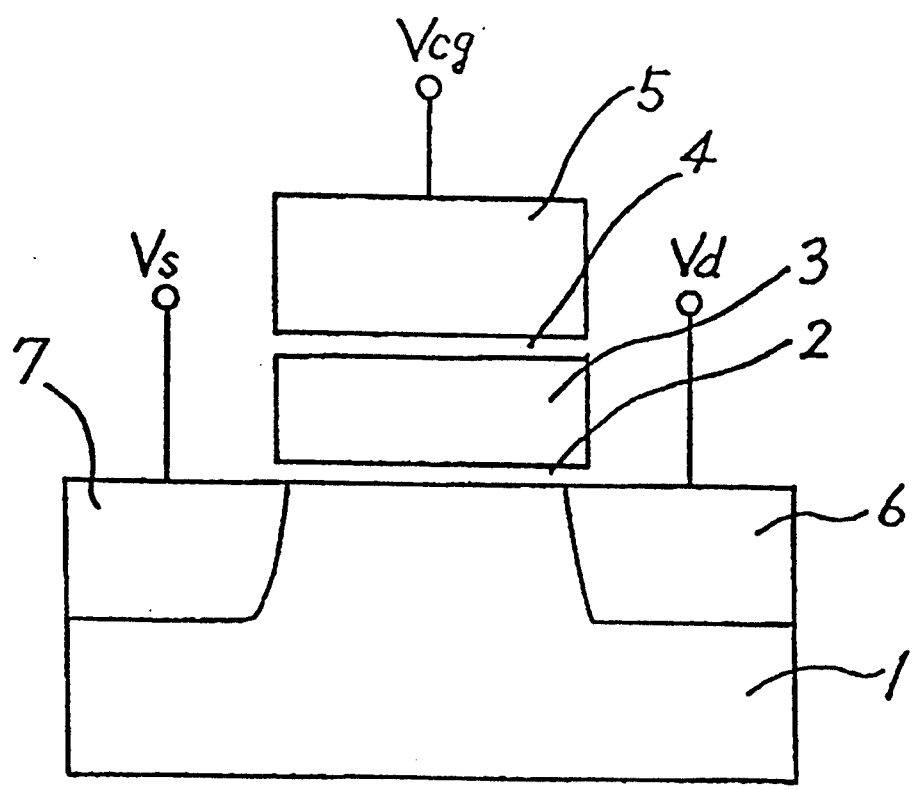
FIG. 4 is a fragmentary cross sectional elevation view illustrative of a structure of a non-volatile semiconductor memory device having a floating gate according to the present invention.

In FIG. 4, the electrically erasable and programmable read only memory (EEPROM) device has a p-type silicon substrate 4. Drain and source diffusion layers 6 and 7 are formed in upper portions of the p-type silicon substrate 1 by using a diffusion method such as an ion-implantation technique with an n-type dopant of arsenic or phosphorus. The formation of the n-type drain and source layers 6 and 7 defines a channel region on the p-type silicon substrate 1. A tunneling oxide film 2 is formed on the channel region in the p-type silicon substrate 1. A floating gate 3 made of polycrystalline silicon is formed on the tunneling oxide film 2. An inter-layer insulator 4 is formed on the floating gate 3. A control gate 5 made of polycrystalline silicon is formed on the inter-layer insulator 4. Such gate structure is formed by using normal processes such as a thermal oxidation of silicon, a chemical vapor deposition, a photo-lithography and a dray etching.

The operations of the electrically erasable and programmable read only memory (EEPROM) device will be described. The programming is accomplished by a hot electron injection through a tunneling oxide film 2 into the floating gate 3 thereby making a threshold voltage of the MOSFET device high. In contrast, the erasure operation is different from that of the prior art. Thus, a novel erasure method according to the present invention is free from utilizing the avalanche breakdown for accomplishment of the convergence of the variable threshold voltage after erasure.

A first embodiment of the present invention provides a novel erasure method for the electrically erasable and programmable read only memory (EEPROM) device having the floating gate 3 which will be described in detail with reference to FIGS. 5 and 6.

FIG. 5 illustrates wave-forms of voltage applied to respective electrodes of the control gate 5, the source 7 and the drain 6 during data erasure operation. The p-type silicon substrate 1 takes a constant potential value of 0 V during the erasure operation. During the erasure operation, the zero voltage signal is applied to the drain electrode so that the n-type drain diffusion layer 6 also takes a constant potential value of 0 V during the erasure operation. With respect to the voltage signal wave-form to be applied to the source diffusion layer 7, for a first time interval of 0.1 seconds, a positive voltage pulse signal of +5 V is applied to the source electrode so that the n-type source diffusion layer 7 takes the positive voltage value of +5 V for the first time interval of 0.1 seconds. After the first time interval of 0.1 seconds, a zero voltage signal is applied to the source electrode so that the source diffusion layer 7 takes 0 V for a remaining time interval. With respect to the voltage signal wave-form to be applied to the control gate 5, for a first time interval of 0.1 seconds, a negative voltage pulse signal of −14 V is applied to the control gate electrode so that the control gate 5 takes the negative voltage value of −14 V for the first time interval of 0.1 seconds. After the first time interval of 0.1 seconds, a zero voltage signal is applied to the source electrode for an intermediate time interval so that the source diffusion layer 7 takes 0 V. A second time interval of 0.5 seconds follows the first time interval of 0.1 seconds through the intermediate time interval. For the second time interval of 0.5 seconds, a positive voltage signal of +14 V is applied to the electrode of the control gate 5 so that the control gate 5 takes the positive voltage value of +14 V. After the second time interval of 0.5 seconds, a zero voltage signal is applied to the electrode of the control gate 5 so that the control gate 5 takes 0 V.

Eventually, in the first embodiment of the present invention, to secure a tight distribution of the threshold voltage after erasure, the novel erasure method applies the electrode of the control gate 5 with a voltage signal having an opposite polarity to the previous erasure voltage signal.

For the first time interval of 0.1 seconds, the control gate 5 takes a negative voltage of −14 V and the source diffusion layer 7 takes a positive voltage +5 V. In this first time interval of 0.1 seconds, the discharge of electrons from the floating gate 3 through the tunneling oxide film 2 by the Fowler-Nordheim tunneling occurs thereby accomplishing the erasure. Further, the over-erasure is so accomplished that the floating gate 3 accumulates holes and is charged at positive polarity.

For the intermediate time interval after the over-erasure operation, the source diffusion layer 7 and the control gate 5 takes 0 V.

Figure 6A:
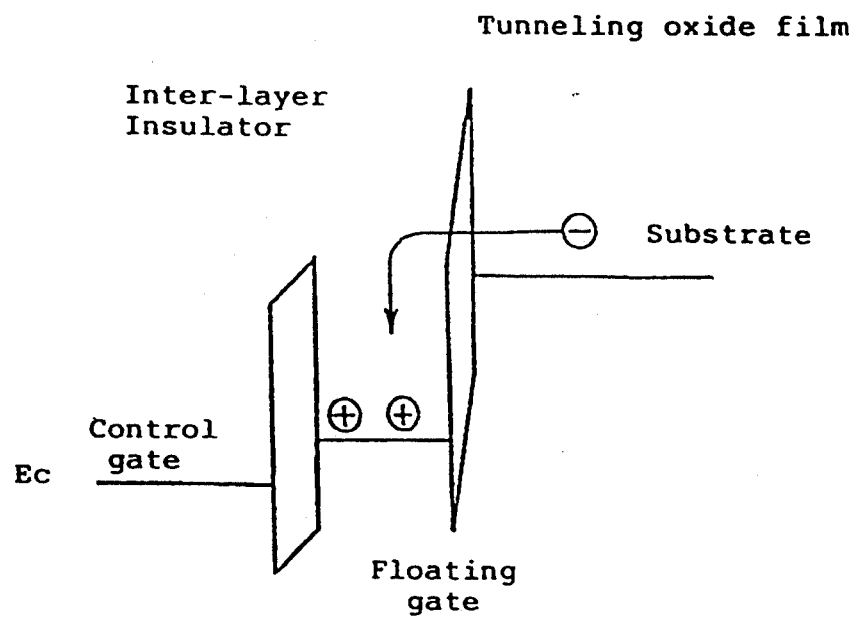
FIG. 6A is a diagram illustrative of a variation of respective energy bands possessed by a substrate, a tunneling oxide film, a floating gate, an inter-layer insulator and a control gate before a Fowler-Nordheim tunneling of electrons from a channel region to a floating gate through a tunneling oxide film.
Figure 6B:
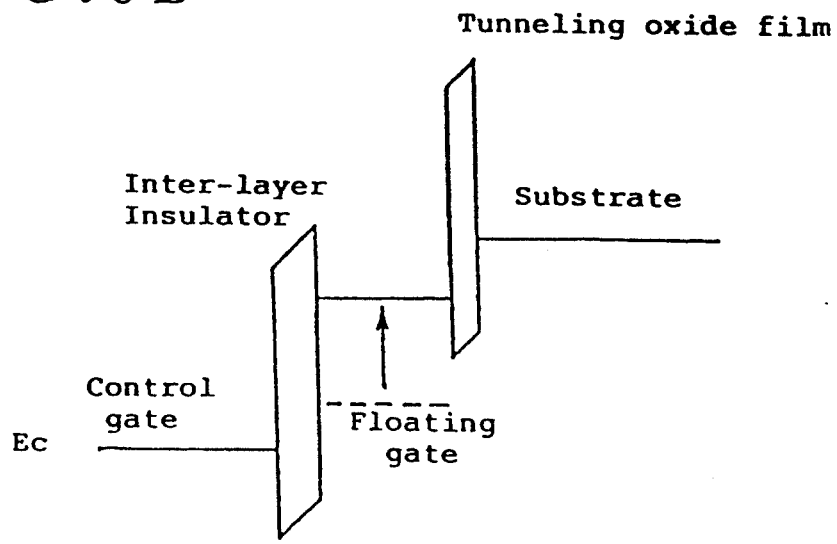
FIG. 6B is a diagram illustrative of a variation of respective energy bands possessed by a substrate, a tunneling oxide film, a floating gate, an inter-layer insulator and a control gate after a Fowler-Nordheim tunneling of electrons from a channel region to a floating gate through a tunneling oxide film.

For the second time interval of 0.5 seconds following the first time interval through the intermediate time interval, the source diffusion layer 7 takes 0 V, while the control gate 5 takes a positive voltage of −14 V. In addition, the drain diffusion layer 6 and the silicon substrate 1 also remain at 0 V. When the positive voltage pulse of +14 V is applied to the electrode of control gate 5, the non-volatile semiconductor memory device having the floating gate according to the present invention exhibits the variations of the energy bands possessed by the silicon substrate 1, the tunneling oxide film 2, the floating gate 3, the inter-layer insulator 4 and the control gate 5. FIGS. 6A and 6B respectively illustrate the variations of the energy bands possessed by the silicon substrate 1, the tunneling oxide film 2, the floating gate 3, the inter-layer insulator 4 and the control gate 5.

In FIG. 6A, the floating gate 3 is charged at the positive polarity, but immediately after the over-erasure. As a result, the floating gate 3 possesses an energy band level different from an energy level which is determined by capacitive-dividing the bias of 14 V between the source and drain diffusion layers 7 and 6 by both the tunneling oxide film 2 and the inter-layer insulator 4. Then, the energy band level of the floating gate 3 is lower than the energy level which is determined by capacitive-dividing the bias. Under such deflected energy band state of the floating gate 3, a Fowler-Nordheim tunneling of electrons from the channel region through the tunnel oxide film 2 into the floating gate 3 occurs. The above Fowler-Nordheim tunneling of electrons into the floating gate 3 makes the potential of the floating gate 3 lowered thereby the potential level of the floating gate 3 approaches the potential level which is determined by capacitive-dividing the bias. Namely, as illustrated in FIG. 6B, the above Fowler-Nordheim tunneling of electrons into the floating gate 3 makes the energy band level increased thereby resulting in that the energy band level of the floating gate 3 converges into an energy band level which is defined by capacitive-dividing the difference between the energy band levels of the control gate 5 and the silicon substrate 1. Finally, the potential of the floating gate 3 converges into the potential level which is provided by capacitive-dividing the bias.

As the potential level of the floating gate 3 is lowered and thus the energy band level is increased, the quantity of the electrons to be injected from the channel region through the tunneling oxide film 2 into the floating gate 3 by the Fowler-Nordheim tunneling are reduced. When the potential level of the floating gate 3 reaches the potential level which is provided by capacitive-dividing the bias, the quantity of the electrons to be injected from the channel region through the tunneling oxide film 2 into the floating gate 3 by the Fowler-Nordheim tunneling becomes zero. Then, the potential level of the floating gate 3 always converges into the constant potential level which is defined by capacitive-dividing the bias provided by the tunneling oxide film 2 and the inter-layer insulator 4. Therefore, the positive voltage signal application to the control gate 5 after erasure makes the threshold voltage after erasure converge into a constant voltage value. Consequently, the distribution of the threshold voltage after erasure becomes tight, and thus is considerably reduced. The considerable suppression of the threshold voltage to be varied after erasure provided by the novel erasure method of the first embodiment according to the present invention improves the reliabitity of the device performance as the non-volatile semiconductor memory device.

In addition, the novel erasure method of the first embodiment according to the present invention makes the non-volatile semiconductor memory device having the floating gate 3 free from disadvantages in the drain and source damage provided by the impact ionization caused by the avalanche breakdown for accomplishing the self-convergence of the threshold voltage after erasure. Namely, the novel erasure method prevents the junction breakdown to occur between the channel region and the respective source and drain diffusion layers 7 and 6.

Furthermore, in the novel erasure method, the requirement of the bias application between the source and drain diffusion layers 7 and 6 is unnecessary to accomplish the convergence of the threshold voltage after erasure. Then, the threshold voltage convergence provided by the novel erasure method requires but only the Fowler-Nordheim tunneling of electrons from the channel region through the tunneling oxide film 2 into the floating gate 3 after erasure. Thus, the novel erasure method makes the power consumption reduced as compared to the prior art erasure method.

A second embodiment of the present invention provides another novel erasure method for the electrically erasable and programmable read only memory (EEPROM) device having the floating gate 3 which will be described in detail with reference to FIG. 7.

Figure 7:
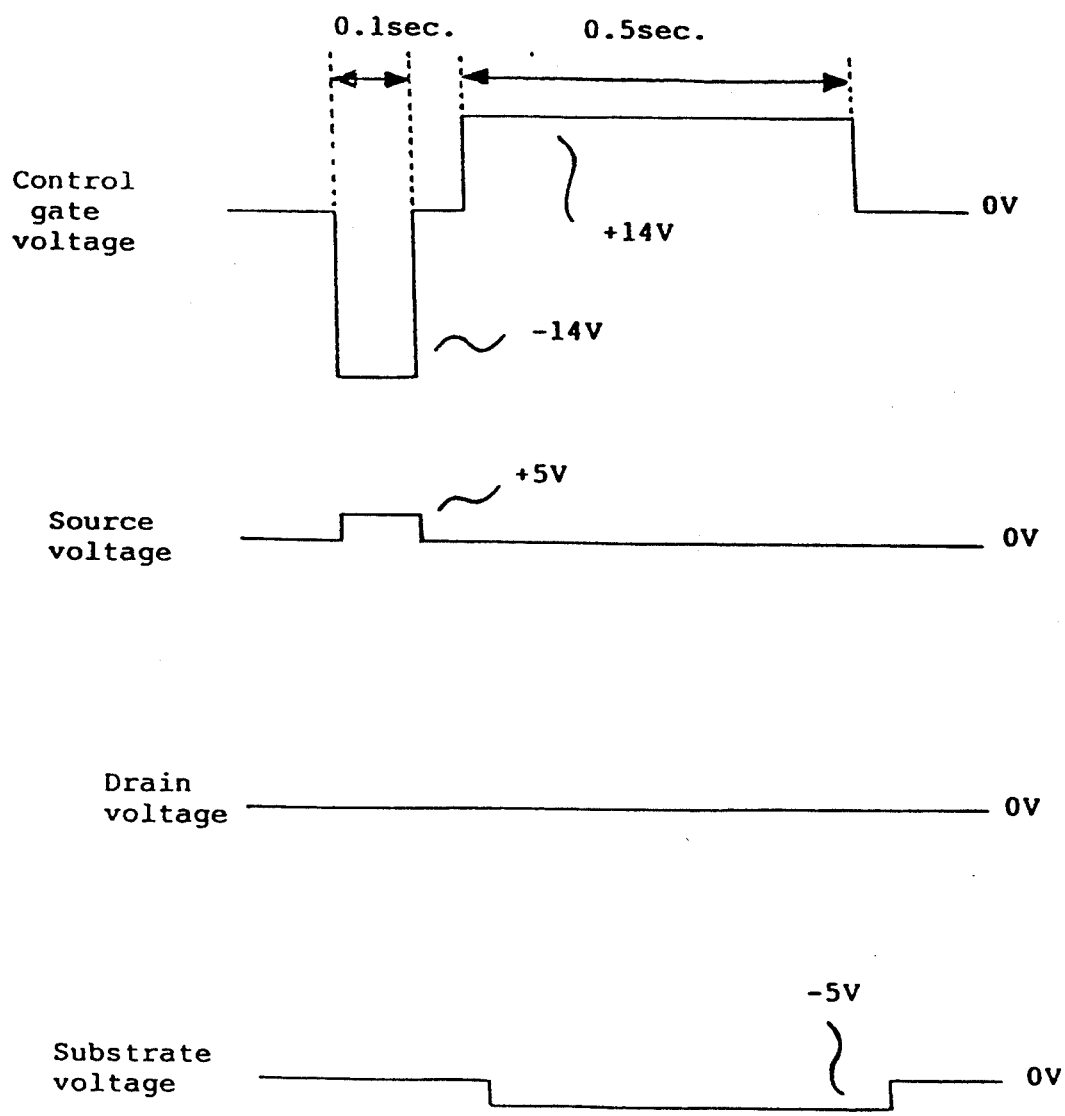
FIG. 7 is a view illustrative of wave-forms of voltage pulse signals to be applied to respective electrodes of a control gate and source and drain diffusion layers in a second embodiment according to the present invention.

FIG. 7 illustrates wave-forms of voltage applied to respective electrodes of the control gate 5, the substrate 1, the source 7 and the drain 6 during data erasure operation. For a first time interval of 0.1 seconds, a zero voltage signal is applied to the silicon substrate so that the p-type silicon substrate 1 takes a voltage value of 0 V. After that, for an intermediate time interval, the zero voltage signal is also applied to the silicon substrate 1 so that the potential of the silicon substrate 1 remains at 0 V. A second time interval of 0.5 seconds follows the first time interval through the intermediate time interval. For the second time interval of 0.5 seconds, a negative voltage signal of −5 V is applied to the silicon substrate 1 so that the silicon substrate 1 takes a negative voltage value of −5 V. During the erasure operation, the zero voltage signal is applied to the drain electrode so that the n-type drain diffusion layer 6 takes a constant voltage value of 0 V during the erasure operation. With respect to the voltage signal wave-from to be applied to the source diffusion layer 7, for the first time interval of 0.1 seconds, a positive voltage pulse signal of +5 V is applied to the source electrode so that the n-type source diffusion layer 7 takes the positive voltage value of +5

V for the first time interval of 0.1 seconds. After the first time interval of 0.1 seconds, a zero voltage signal is applied to the source electrode so that the source diffusion layer 7 takes 0 V for a remaining time interval. With respect to the voltage signal wave-from to be applied to the control gate 5, for a first time interval of 0.1 seconds, a negative voltage pulse signal of $-14$ V is applied to the control gate electrode so that the control gate 5 takes the negative voltage value of $-14$ V for the first time interval of 0.1 seconds. After the first time interval of 0.1 seconds, a zero voltage signal is applied to the source electrode for the intermediate time interval so that the source diffusion layer 7 takes 0V. A second time interval of 0.5 seconds follows the first time interval of 0.1 seconds through the intermediate time interval. For the second time interval of 0.5 seconds, a positive voltage signal of $+9$ V is applied to the electrode of the control gate 5 so that the control gate 5 takes the positive voltage value of $+9$ V. After the second time interval of 0.5 seconds, a zero voltage signal is applied to the electrode of the control gate 5 so that the control gate 5 takes 0 V.

Eventually, in the second embodiment of the present invention, to secure a tight distribution of the threshold voltage after erasure, the novel erasure method applies the electrode of the control gate 5 with a voltage signal having an opposite polarity to the previous erasure voltage signal. Further, the novel erasure method applies the silicon substrate 1 with a voltage signal having an opposite polarity to the control gate voltage for the second time interval.

For the first time interval of 0.1 seconds, the control gate 5 takes a negative voltage of $-14$ V and the source diffusion layer 7 takes a positive voltage $+5$ V. In this first time interval of 0.1 seconds, the discharge of electrons from the floating gate 3 through the tunneling oxide film 2 by the Fowler-Nordheim tunneling occurs thereby accomplishing the erasure. Further, the over-erasure is so accomplished that the floating gate 3 accumulates holes and is charged at positive polarity.

For the intermediate time interval after the over-erasure operation, the source diffusion layer 7 and the control gate 5 takes 0 V.

For the second time interval of 0.5 seconds following the first time interval through the intermediate time interval, the source diffusion layer 7 takes 0 V, while the control gate 5 takes a positive voltage of $+9$ V. The silicon substrate 1 takes a negative voltage of $-5$ V for the second time interval. In addition, the drain diffusion layer 6 remains at 0 V. When the positive voltage pulse of $+9$ V is applied to the electrode of control gate 5 and the negative voltage pulse of $-5$ V is applied to the silicon substrate 1, the non-volatile semiconductor memory device having the floating gate according to the present invention exhibits the variations of the energy bands possessed by the silicon substrate 1, the tunneling oxide film 2, the floating gate 3, the inter-layer insulator 4 and the control gate 5. FIGS. 6A and 6B respectively illustrate the variations of the energy bands possessed by the silicon substrate 1, the tunneling oxide film 2, the floating gate 3, the inter-layer insulator 4 and the control gate 5.

In FIG. 6A, the floating gate 3 is charged at the positive polarity, but immediately after the over-erasure. As a result, the floating gate 3 possesses an energy band level different from an energy level which is determined by capacitive-dividing the bias of $+9$ V between the source and drain diffusion layers 7 and 6 by both the tunneling oxide film 2 and the inter-layer insulator 4. Then, the energy band level of the floating gate 3 is lower than the energy level which is determined by capacitive-dividing the bias. Under such deflected energy band state of the floating gate 3, a Fowler-Nordheim tunneling of electrons from the channel region through the tunnel oxide film 2 into the floating gate 3 occurs. The above Fowler-Nordheim tunneling of electrons into the floating gate 3 makes the potential of the floating gate 3 lowered thereby the potential level of the floating gate 3 approaches the potential level which is determined by capacitive-dividing the bias. Namely, as illustrated in FIG. 6B, the above Fowler-Nordheim tunneling of electrons into the floating gate 3 makes the energy band level increased thereby resulting in that the energy band level of the floating gate 3 converges into an energy band level which is defined by capacitive-dividing the difference between the energy band levels of the control gate 5 and the silicon substrate 1. Finally, the potential of the floating gate 3 converges into the potential level which is provided by capacitive-dividing the bias.

As the potential level of the floating gate 3 is lowered and thus the energy band level is increased, the quantity of the electrons to be injected from the channel region through the tunneling oxide film 2 into the floating gate 3 by the Fowler-Nordheim tunneling are reduced. When the potential level of the floating gate 3 reaches the potential level which is provided by capacitive-dividing the bias, the quantity of the electrons to be injected from the channel region through the tunneling oxide film 2 into the floating gate 3 by the Fowler-Nordheim tunneling becomes hero. Then, the potential level of the floating gate 3 always converges into the constant potential level which is defined by capacitive-dividing the bias provided by the tunneling oxide film 2 and the inter-layer insulator 4. Therefore, the positive voltage signal application to the control gate 5 after erasure makes the threshold voltage after erasure converge into a constant voltage value. Consequently, the distribution of the threshold voltage after erasure becomes tight, and thus is considerably reduced. The considerable suppression of the threshold voltage to be varied after erasure provided by the novel erasure method of the second embodiment according to the present invention improves the reliability of the device performance as the non-volatile semiconductor memory device.

In addition, the novel erasure method of the second embodiment according to the present invention makes the non-volatile semiconductor memory device having the floating gate 3 free from disadvantages in the drain and source damage provided by the impact ionization caused by the avalanche breakdown for accomplishing the self-convergence of the threshold voltage after erasure. Namely, the novel erasure method prevents the junction breakdown to occur between the channel region and the respective source and drain diffusion layers 7 and 6.

Furthermore, in the novel erasure method, the requirement of the bias application between the source and drain diffusion layers 7 and 6 is unnecessary to accomplish the convergence of the threshold voltage after erasure. Then, the threshold voltage convergence provided by the novel erasure method requires but only the Fowler-Nordheim tunneling of electrons from the channel region through the tunneling oxide film 2 into the floating gate 3 after erasure. Thus, the novel erasure method makes the power consumption reduced as compared to the prior art erasure method.

Although in the above first and second embodiments the semiconductor material comprises silicon and the insulator material comprises silicon oxide, other materials are available for the semiconductor material and the insulator material. The voltage wave-forms to be applied to the respective electrodes of the silicon substrate 1, the drain and source diffusion layers 6 and 7 and the control gate 5 are variable on condition that the variation of the threshold voltage after erasure is suppressed.

Whereas modifications of the present invention will no doubt be apparent to a person of ordinary skill in the art, it is to be understood that the embodiments shown and described by way of illustrations are by no means intended to be considered in a limiting sense. Accordingly, it is to be intended to cover by claims all modifications of the invention which fall within the sprit and scope of the invention.

What is claimed is:

1. A method of erasure for a non-volatile semiconductor memory device having a floating gate, said method comprising the steps of:
    applying a first voltage having one polarity to a control gate of said memory device under a bias application between source and drain regions so as to accomplish an erasure by a tunneling of carriers from said floating gate through a tunneling oxide film; and
    applying a second voltage having an opposite polarity to said one polarity to said control gate of said memory device without bias application between said source and drain regions so as to accomplish a convergence of a threshold voltage into a voltage level by a tunneling of carriers from a channel region of said memory device to said floating gate through said tunneling oxide film;
    wherein a voltage level of said first voltage application has the same absolute value as a voltage level of said second voltage application.

2. The method of erasure as claimed in claim 1, wherein said second voltage application follows said first voltage application through a time interval.

3. The method of erasure as claimed in claim 1, further comprising the step of applying a third voltage having an opposite polarity to said voltage polarity of said second voltage application to a substrate during said second voltage application.

4. The method of erasure as claimed in claim 1, wherein said carriers exhibiting said tunneling comprise electrons.

5. The method of erasure as claimed in claim 1, wherein said erasure accomplished by said first voltage application is an over-erasure.

6. A method of erasure for a non-volatile semiconductor memory device having a floating gate, said method comprising the steps of:
    applying a first voltage having one polarity to a control gate of said memory device under a bias application between source and drain regions so as to accomplish an erasure by a tunneling of carriers from said floating gate through a tunneling oxide film;
    applying a second voltage having an opposite polarity to said one polarity to said control gate of said memory device without bias application between said source and drain regions so as to accomplish a convergence of a threshold voltage into a voltage level by a tunneling of carriers from a channel region of said memory device to said floating gate through said tunneling oxide film; and
    applying a third voltage having an opposite polarity to said voltage polarity of said second voltage application to a substrate during said second voltage application.

7. The method of erasure as claimed in claim 6, wherein said second voltage application follows said first voltage application through a time interval.

8. The method of erasure as claimed in claim 6, wherein a voltage level of said first voltage application has the same absolute value as a voltage level of said second voltage application.

9. The method of erasure as claimed in claim 6, wherein said carriers exhibiting said tunneling comprise electrons.

10. The method of erasure as claimed in claim 6, wherein said erasure accomplished by said first voltage application is an over-erasure.

* * * * *